US006303271B1

(12) United States Patent
Bennett et al.

(10) Patent No.: US 6,303,271 B1
(45) Date of Patent: Oct. 16, 2001

(54) LITHOGRAPHIC PLATES

(75) Inventors: Peter A. R. Bennett, N. Yorks; Carole-Anne Smith, Leeds; Stuart Bayes, Leeds; David S. Riley, Leeds, all of (GB)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/194,822

(22) PCT Filed: Jun. 6, 1997

(86) PCT No.: PCT/GB97/01522

§ 371 Date: Jun. 29, 1999

§ 102(e) Date: Jun. 29, 1999

(87) PCT Pub. No.: WO97/49557

PCT Pub. Date: Dec. 31, 1997

(30) Foreign Application Priority Data

Jun. 12, 1996 (DE) .................................................. 9612233

(51) Int. Cl.[7] ............................ G03F 7/30; B41M 5/025; G03C 5/16

(52) U.S. Cl. .......................... 430/302; 430/944; 430/945; 430/306; 430/325; 101/466; 101/465; 101/467

(58) Field of Search .................................... 430/302, 944, 430/945, 306, 325; 101/466, 465, 467

(56) References Cited

U.S. PATENT DOCUMENTS

| | | | | |
|---|---|---|---|---|
| 3,673,140 | * | 6/1972 | Ackerman et al. | 522/14 |
| 4,687,729 | * | 8/1987 | Cadwell et al. | 430/302 |
| 5,262,275 | * | 11/1993 | Fan | 430/273.1 |
| 5,360,694 | * | 11/1994 | Thien et al. | 430/200 |
| 5,454,310 | * | 10/1995 | Hayes | 101/148 |
| 5,607,816 | * | 3/1997 | Fitzgerald et al. | 430/271.1 |
| 5,654,125 | * | 8/1997 | Fan et al. | 430/306 |
| 5,713,287 | | 2/1998 | Gelbart | 101/467 |
| 5,785,784 | * | 7/1998 | Chesley et al. | 156/66 |
| 5,795,698 | * | 8/1998 | Fitzgerald et al. | 430/281.1 |

FOREIGN PATENT DOCUMENTS

| | | | |
|---|---|---|---|
| 0164128 | | 12/1985 | (EP) . |
| 0703499 | | 3/1996 | (EP) . |
| 0764522 | | 3/1997 | (EP) . |
| 0768172 | | 4/1997 | (EP) . |
| 0769724 | | 4/1997 | (EP) . |
| 2284684 | | 6/1995 | (GB) . |
| 4-39367 | * | 2/1992 | (JP) . |
| 9700777 | | 1/1997 | (WO) . |

OTHER PUBLICATIONS

JPO Abstract JP404039367A—English Abstract (File:JPAB) of JP 4–39367 Published on Feb. 10, 1992.*

Derwent Abstract 1992–093963—English Abstract (File:DWP1) of JP 4–39367 Published on Feb. 10, 1992.*

J. Honablew, SPIE Proceedings, 390, 111–115 (Jan., 1983).

Caractere, 46 (410), 26 (Sep. 26, 1995).

* cited by examiner

*Primary Examiner*—Janet Baxter
*Assistant Examiner*—Sin J. Lee
(74) *Attorney, Agent, or Firm*—Ratner & Prestia

(57) ABSTRACT

A method for preparing a printing form and a method of printing are disclosed. A coating of a radiation sensitive ink on a lithographic support having a hydrophilic surface is imaged. The unexposed areas of the coating are removed to produce a printing form, which is used for printing. Preferably, the same radiation sensitive ink is used for printing as is used in the coating, and, preferably, the desired printing run length is predetermined and the thickness of the coating determined according to the desired run length.

36 Claims, No Drawings

LITHOGRAPHIC PLATES

FIELD OF THE INVENTION

This invention relates to a digital printing method and especially to a method for preparing an imaged lithographic plate on-or-off press using a digitally controlled laser output.

BACKGROUND OF THE INVENTION

Currently the commonest method of preparing a lithographic plate is to image a photosensitive lithographic plate using an image mask, such as a photographic negative, and to prepare the plate therefrom using an aqueous developing solution. This procedure is time consuming and requires facilities and equipment to support the necessary chemistry.

Thus recently, various methods have been proposed for preparing lithographic plates on the press which is to be used to produce prints from the plate. These methods prepare the image using a digitally controlled laser image head. As described in E.P.A. 38039, such methods include inkjet methods digitally controlled, spark-discharge methods and the production of electromagnetic-radiation pulses that create chemical changes of the place blank. Also etching methods have been described as well as blank plates which are ablated by the laser to form an ink-receptive image.

SUMMARY OF THE INVENTION

We have discovered a novel method of preparing a printing form using a digitally controlled laser output from an imaging head which may be employed on-or-off a press.

According to the present invention there is provided a method of preparing a printing form which comprises coating on a lithographic support having a hydrophilic surface a layer of a radiation sensitive ink, imaging the ink coating by digital laser means, then acting on the plate with aqueous dampening rollers to remove the unexposed areas of the ink coating to reveal the hydrophilic surface of the support and to leave an ink image formed from the ink, which is oleophilic after exposure.

DETAILED DESCRIPTION OF THE INVENTION

The support is a material suitable for use on lithographic presses and may be metal, plastic or paper. Typical metals are aluminum, chromium or steel. Typical plastics are polyethylene terephthalate or polycarbonate.

The surface of the lithographic support is suitably treated to render it hydrophilic and adherent for the ink. Thus it may be anodized aluminum, chromium or it may be of a plastic material which is either hydrophilic or which has been treated to render it hydrophilic, for example polyethylene terephthalate coated with hydrophilic layers as described in our PCT Application GB96 02883 and WO94/18005 (Agfa).

Most preferably the support is metal and this is in the form of a sleeve or cylinder which firs on to a printing press. Most preferably the method of the present invention is carried out in situ in a printing press. Thus the printing press comprises an ink train which when the metal sleeve is mounted on the press can be lowered to coat on the sleeve an ink coating of a required thickness, together with a digital laser imaging head, means to disengage the metal sleeve from the printing press and to rotate it at a speed suitable for imaging, and water dampening rollers.

A preferred method for the use of flexible lithographic supports is to have a roll of the hydrophilic support within the press which when new material is required dispenses the new substrate and recoils the used substrate automatically. Such a system is utilized commercially in the Heidelberg Quickrmaster DI press and on-press imaging system. In such a system all operations are carried out in-situ on the press with the exception of occasional renewal of the roll of hydrophilic support material.

Means are present in the ink-train to coat any required thickness of ink on the metal sleeve. For example for a lower run length an ink thickness of 0.1 to 0.5 microns is suitable. But for a higher run length a thickness of 3 microns is suitable.

The digital laser imagine head is in essence an image setter attached to the printing press and comprises a laser which scans in an imagewise manner radiation across the plate in response to image signals stored in a computer.

The laser may emit in the U.V waveband as white light or preferably in the infra-red region of the spectrum.

Preferably the radiation sensitive ink comprises a radiation absorbing material which allows the ink to be sensitive to the wavelength of the radiation emitted by the image scanning means.

Conveniently the scanning means is a laser beam having a wavelength of above 600 nm. Usefully the radiation sensitive ink comprises an infra-red absorbing compound. Suitable infra-red absorbing compounds include pigments such as phthalocyanine pigments or dyes of the following classes. squarylium, cyanine, merocyanine, indolizine, pyryhinium or metal dithiolene dye.

Preferably the infra-red absorbing compound is one whose absorption spectrum is significant at the wavelength output of the laser which is to be used in the method of the present invention. For example gallium arsenide diode lasers emit at 830 nm and Nd YAG lasers emit at 1064 nm.

Carbon black is also a useful radiation absorbing compound and in the context of this invention it can also be used as the colorant for the black radiation sensitive ink.

Preferably the radiation sensitive ink comprises a radiation sensitive resin which hardens or cross-links when irradiated. Suitable radiation sensitive resins are certain acryiate resins, for example polyether acrylare, epoxy acrylate, and alkyl acrylate. Suitable solvents for example styrene or methyl acrylate may also be present as well as a photopolynerization initiator such as benzophenone or p-dialkyl-aminobenzoic acid.

Preferably the dampening rollers are covered with a lithographic fountain solution.

Thus in the preferred method of the present invention a metal sleeve or cylinder which has a hydrophilic surface and which forms part of the printing surface of a printing press is coated with a predetermined thickness of a radiation sensitive ink the metal sleeve is disengaged from the roller drive of the printing press and is caused to rotate at a speed suitable for imaging, the digital laser-head attached to the printing press images the ink layer on the metal sleeve, after imaging the metal sleeve is re-engaged to the roller drive of the printing press and the rollers of the press rotate and act as water-dampening rollers, thus removing the unexposed areas of the ink on the surface of the sleeve and to reveal the hydrophilic surface of the sleeve in the unexposed areas of the sleeve, the rollers of the press are then inked up and the printing press prints on to paper fed to it. After the print run has finished a plate washer can be employed to remove all the ink from the sleeve which can then be re-used.

Preferably the metal sleeve can be removed from the press to clean it thoroughly and also to renew it periodically.

Preferably details of the required film thickness to be coated on the sleeve are fed directly into the laser imaging head which is programmed to adjust incident power and scanning speed to provide the optimum cure and imaging resolution.

Conveniently the same radiation sensitive ink is used to form the initial coating on the metal sleeve and in the actual print run. Thus ensures that the ink used in the print run will have a high affinity for the image areas.

Some advantages of the proposed method of the present invention are that only the film thickness necessary to do the job need be employed which in turn means recording time is minimized. This means for this system that make ready time As directly proportional to run length which is exactly what is required for a Direct-to-Press system i.e. make ready time reduces as run length reduces in cases where imaging power is constant. The digital inking controls can be arranged to communicate with the digital head allowing feedback loops to ensure maximum added value in terms of make-ready. The idea of a removable sleeve is beneficial in case the surface becomes scratched and a spare can be used. It may also be possible to have them conditioned on a maintenance basis for optimum hydrophilicity.

EXAMPLES

Testing Sensitivity of Coatings

The coated substrate to be imaged was cut into a circle of 105 mm diameter and placed on a disc that could be rotated at constant speed at between 100 and 2500 revolutions per minute. Adjacent to the spinning disc a translating table held the source of the laser beam so that the laser beam impinged normal to the coated substrate, while the translating table moved the laser beam radially in a linear fashion with respect to the spinning disc.

The laser used was a single mode 830 mm wavelength 200 mW laser diode which was focused to a 10 micron resolution. The laser power supply was a stabilized constant current source.

The exposed image was in the form of a spiral whereby the image in the centre of the spiral represented slower scanning speed and long exposure time and the outer edge of the spiral represented fast scanning speed and short exposure time. Imagine energies were derived from the measurement of the diameter at which the image was formed.

The diameter of the spiral can be equated to mJ/cm$^2$ in terms of pixel energy density. The minimum energy that can be delivered by this exposure system is 150 mJ cm$^2$ at an rpm of 2500. These sensitivities are quoted in the Examples which follow the higher the figure the less the sensitivity.

In the Examples commercially available black inks all containing carbon black were used.

EXAMPLE 1

Heat Set Ink

Gibbons Heat Set Black Ink (Gibbons Inks and Coatings Limited) was coated onto discs of grained and anodized aluminum using a rubber inking roller to give a wet ink film weight of 7.0 to 9.0 g/m$^2$.

The coated disc was imaged with a 200 mW, 830 nm, near infrared laser source at various speeds to give a range of energy densities incident on the coating's surface.

The disc was then developed by application of a 2% solution of Emerald fountain solution (Anchor Pressroom Chemicals) in water and rubbing this with cotton wool to remove the unexposed ink coating leaving behind the exposed coating areas.

The typical sensitivity obtained with this system was 1850 mJ/cm$^2$ pixel energy density.

EXAMPLE 2

Metal UV Cure Ink

Example 1 was repeated using Eurocure MD UV SPX190 Black ink (Edward Marsden Inks) to give wet ink coating weights from 2.5 to 6.5 g m$^2$ and a typical sensitivity of 4900 mJ/cm$^2$ in terms of pixel energy density.

EXAMPLE 3

Cure Ink

Example 1 was repeated using Coates UV Cure Black Ink (Coates-Lorillaux) to give wet ink coating weights from 4 to 7 g/m$^2$ and a typical sensitivity of 2700 mJ/cm$^2$ pixel energy density.

EXAMPLE 4

Metal Heat Set Ink

Example 1 was repeated using Diaflex Van Dyke Black TP Ink (Heat set type. Edward Marsden Inks) to give wet ink coating weights of 4 to 5.5 g/m$^2$ and a typical sensitivity of 1850 mJ/cm$^2$ pixel energy density.

EXAMPLE 5

Heat Set Ink On Silicated Substrate

Example 1 was repeated on a grained, anodized and silicated aluminum substrate.

The typical coating weight was 7 to 9 g/m$^2$ and the sensitivity seen was 1850 mJ/cm$^2$.

Method For Production Of Silicated Substrate

Grained and anodized aluminum substrate with a phosphate post anodic treatment was immersed for 30 seconds in an aqueous. 3% solution of sodium silicate heated to 50° C. On removal the substrate was washed under cold tap water and finally dried for 5 minutes at 80° C.

EXAMPLE 6

Heat Set Ink With Added Infrared Dye KF646 PINA

Example 1 was repeated except an inked absorbing dye: Sensitiser KF646 PINA (Riedel de Haen AG). was added to the ink to increase its infrared sensitivity.

Formulation: 0.3 g of thermal set black ink 0.18 g of 3.2% Sensitiser KF646 in methoxy propanol.

This formulation was mixed with a palette knife and then applied to discs of substrate, imaged and developed as in previous examples.

Typical wet ink coating weights were from 3 to 10 g/m$^2$, giving a sensitivity of 1700 mJ/cm$^2$ when optimized.

EXAMPLE 7

Heat Set Ink With Added Infrared Dye NK 1887

Example 6 was repeated except the infrared absorbing dye used was NK 1887 (supplied by Nippon Kankoh-Shikiso Kenkyusho) at 3.2% w/w in dimethylformamide.

Dye NK1887 is:

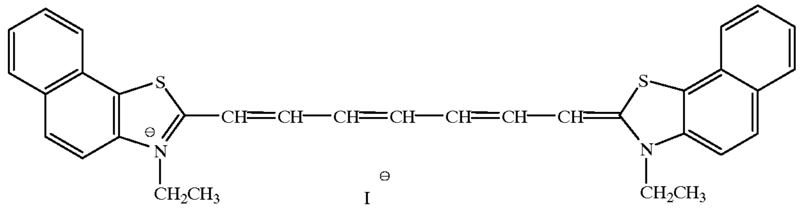

3-Ethyl-2-{7(3-ethyl-naphtho{2,1-d}-thiazolinylidene)-1,3,5-heptatrienyl] naphtho[2,1-d]-thiazolium iodide.

Typical coating weights applied were from 2.5 to 5 $g/m^2$ giving a sensitivity of 1350 $mJ/cm^2$ when optimized.

EXAMPLE 8

UV Ink with Added Infrared Dye KF646 PINA

The Coates UV cure black ink was mixed with Sensitiser KF646 PINA as in the below formulation:

0.3 g Coates IV cure black ink.

0.18 g of KF646 PINA at 3.2% in methoxy propanol.

The formulation was blended using a palette knife and applied to substrate discs with a rubber inking roller, then imaged and developed as in previous examples.

Coating weights of 2 to 5 $g/m^2$ were obtained giving an optimized sensitivity of 1100 $mJ/cm^2$.

EXAMPLE 9

UV Cure Ink With Added In frared Dye NK 1837

Example 8 was repeated substituting the NK 1887 infrared dye for the KF646 PINA.

Wet coating weights of 2 to 4 $g/m^2$ were obtained, giving a sensitivity of 1500 $mJ/cm^2$ pixel energy density.

EXAMPLE 10

Heat Set Ink With Sensitiser KF646 On Silicated Substrate

Example 6 was repeated on silicated substrate.

Typical wet coating weighs of 3 to 5.5 $g/m^2$ were examined giving a sensitivity of 1100 $mJ/cm^2$.

EXAMPLE 11

Heat Set Ink with NK1887 Infrared Dye on Silicated Substrate

Example 7 was repeated on silicated substrate, giving wet coating weights of 2.5 to 5 $g/m^2$ and sensitivities around 1370 $mJ/cm^2$ pixel energy density.

EXAMPLE 12

UV Ink with Sesitiser KF646 PINA on Silicated Substrate

Example 8 was repeated on silicated substrate.

Wet ink coating weights of3 to 5 $g/m^2$ were found to give sensitivities around 1360 $mJ/cm^2$ when optimized.

EXAMPLE 13

UV Cure Ink With Acid Generator (Trazine)

The acid generating triazine 2(4-phenylthiomethyl)-4,5-trichloromethyl-s-triaane was mixed at 3% by weight with U.V. cure ink as follows:

0.4 g Coates UV Cure Black Ink 0.3 g triazine at 4% w/w in methyl ethyl ketone

The mixture was blended with a palette knife and applied to substrate discs then imaged and developed as in previous examples.

Coating weights of 2.5 to 4 g $m^2$ were obtained and sensitivities of around 1300 $mJ/cm^2$ obtained.

In the Examples above, dye KF646 was supplied by Riedel de Haen. It is a benzhiazole based heptamethine cyanine dye, $\lambda_{max}$ 792 nm in MeOH.

EXAMPLE 14

Example 6 was repeated using a reduced coating weight on a silicated support, the coated plate was imaged in a horizontal bed image setter as described below.

A form to be imaged was cut into a sample of 262 by 439 mm and placed on a flat metallic bed. Suspended above the sample was a laser scanning system which directed a focused laser beam over the sample surface by means of XY scanning mirror (two galvanometer scanning mirrors in orthogonal planes). The included scan angle of this system was 40° capable of scanning up to 7 rad $s^{-1}$ (or 850 mm $s^{-1}$ at the focal plane). The image to be exposed could be chosen from any image capable of being converted into vector co-ordinates via a CAD package, this including images raster scanned onto the sample surface. The scan speed and dwell time of the laser were selectable by the operator using the scanners control software in order to obtain various imaging energy densities.

The laser diode used was a single mode 830 nm wavelength 200 mW laser diode which was collimated and then focused after reflection by the XY scanning mirrors, to do a 10 micron spot at the $1/e^2$ points. The laser power supply was a stabilized constant current source.

The coating weights of from 1.2 to 2.1 $g/m^2$ were tested giving a sensitivity of around 450 $mJ/cm^2$.

EXAMPLE 15

The acid generating triazine 2(4-phenylthiomethyl)-4.5-trichloromethyl-s-triazine was mixed at 3% weight to weight with U.V cure ink as follows:

0.4 g Coates UV Cure Black Ink 0.3 g triazine at 4% w/w in methyl ethyl ketone

The mixture was blended with a palette knife and applied to substrate then imaged on the horizontal bed image setter as described above.

Coating weights of 1.3 to 1.7 $g/m^2$ were used and sensitivities of around 700 $mJ/cm^2$ obtained.

EXAMPLE 16

0.3 g of Gibbons Heat Set Black Ink (Gibbons Inks and Coatings Limited) was mixed with 0.18 g of 3.2% w/w NK 1887 (supplied by Nippon Kankoh-Shikiso Kenkyusho) in dimethylformamide using a palette knife. The mixture was coated onto grained and anodized aluminum using a rubber inking roller to give a wet ink film weight of 1.2 to 2.0 g/m$^2$. The coated plate was imaged on the horizontal bed image setter as described above. The plate was then developed by application of a 2% solution of Emerald fountain solution (Anchor Pressroom Chemicals) in water and rubbing this with cotton wool to remove the unexposed ink coating leaving behind the exposed coating areas. The typical sensitivity obtained with this system was 750 mJ/cm$^2$.

After development, the plate was mounted on a Heidelberg Speedmaster 52 printing press and printed copies produced. During this runlength test at least 10,000 copies were obtained from this plate.

Even though some of the above listed inks are stated to be U.V. sensitive they are all infra-red sensitive as they contain carbon black.

It is to be understood that it is not necessary to coat the plate for the printing step with the same ink as used in the imaging step. Any other black or other colored ink can be used.

What is claimed is:

1. A method for preparing a printing form, the method comprising:

coating a layer of a radiation sensitive ink on a lithographic support having a hydrophilic surface layer to form an ink coating, imaging the ink coating by digital laser means to form exposed areas and unexposed areas of the ink coating, and acting on the support with aqueous covered dampening rollers to remove the unexposed areas of the ink coating thereby revealing the hydrophilic surface of the support and leaving an oleophilic image formed from the exposed areas of the ink coating, in which:

the digital laser means emits in the visible or infra-red region of the spectrum;

the ink comprises a radiation absorbing compound;

the radiation absorbing compound is a phthalocyanine pigment; and the ink additionally comprises an infra-red absorbing dye.

2. The method of claim 1 in which the digital laser means emits in the infra-red region of the spectrum.

3. The method of claim 1 in which the dampening rollers are covered with lithographic fountain solution.

4. The method of claim 1 in the surface of the lithographic support is anodized aluminum, chromium, or a plastic material treated to render it hydrophilic.

5. The method of claim 1 or claim 3 in which the lithographic support is a sleeve or cylinder that fits onto the printing press.

6. The method of claim 1 or claim 3 in which the method is carried out in situ in a printing press.

7. The method of claim 1 or claim 3 in which the ink is sensitive to visible radiation.

8. The method of claim 1 or claim 3 in which the ink is sensitive to infra-red radiation.

9. The method of claim 8 in which the digital laser means emits radiation having a wavelength above 600 nm.

10. The method of claim 1 in which the ink comprises a radiation sensitive resin.

11. The method of claim 10 in which the radiation sensitive resin hardens or crosslinks on exposure to radiation.

12. The method of claim 11 in which the resin is an acrylate resin.

13. A method of printing using the printing form prepared as described in claim 12 in which the same radiation sensitive ink is used in the coating on the hydrophilic support as is used in the printing.

14. The method of claim 11 in which the ink comprises a polymerization initiator.

15. The method of claim 14 in which the polymerization initiator is photolytically decomposed on exposure to suitable radiation.

16. The method of claim 14 in which the polymerization initiator is thermally decomposed on exposure to suitable radiation.

17. The method of claim 1 or claim 3 in which means are present in the ink-train to coat a predetermined thickness of ink onto the hydrophilic surface.

18. The method of claim 17 in which details of the predetermined thickness are fed directly into a laser imaging head which is programmed to adjust incident power and scanning speed to provide the optimum cure and imaging resolution.

19. The method of claim 17 in which a desired run length is predetermined and the thickness of the ink coated is determined according to the desired run length.

20. A method of printing using the printing form prepared as described in claim 1 in which the same radiation sensitive ink is used in the coating on the hydrophilic support as is used in the printing.

21. The method of claim 20 in which the dampening rollers are covered with lithographic fountain solution, the lithographic support is a sleeve or cylinder that fits on to a printing press, and the method is carried out in situ in a printing press.

22. The method of claim 21 in which the ink comprises a radiation sensitive resin that hardens or crosslinks on exposure to radiation.

23. The method of claim 22 in which the radiation sensitive resin is an acrylate resin.

24. The method of claim 1 in which the radiation absorbing dye is selected from the group consisting of dyes of the squarylium, cyanine, merocyanine, indolizine, pyrylinium, and metal dithiolene classes.

25. A method for printing using a printing form, the method comprising:

coating a layer of a radiation sensitive ink on a lithographic support having a hydrophilic surface layer to form an ink coating, imaging the ink coating by digital laser means to form exposed areas and unexposed areas of the ink coating, forming the printing form by removing the unexposed areas of the ink coating thereby revealing the hydrophilic surface of the support and leaving an oleophilic image formed from the exposed areas of the ink coating, and printing using the printing form;

in which:

the digital laser means emits in the visible or infra-rad region of the spectrum;

the same radiation sensitive ink is used in the coating on the hydrophilic support as is used in the printing; and a desired run length for the printing is predetermined and the thickness of the ink coated is determined according to the desired run length.

26. The method of claim 25 in which the ink comprises a radiation absorbing compound.

27. The method of claim 10 in which the radiation absorbing compound absorbs radiation having a wavelength above 600 nm.

28. The method of claim 25 in which the digital laser means emits in the infra-red region of the spectrum.

29. The method of claim 28 in which the ink additionally comprises an infra-red absorbing dye.

30. The method of claim 25 or claim 29 in which the lithographic support is a sleeve or cylinder that fits onto a printing press.

31. The method of claim 25 or claim 29 in which the method is carried out in situ in a printing press.

32. The method of claim 31 in which the ink comprises a radiation absorbing compound.

33. The method of claim 31 in which:

the unexposed areas of the ink coating are removed by acting on the support with aqueous covered dampening rollers of the printing press;

the dampening rollers are covered with lithographic fountain solution;

the lithographic support is a sleeve or cylinder that fits onto the printing press, and the printing press comprises an ink-train and means are present in the ink-train to coat a predetermined thickness of ink onto the hydrophilic surface.

34. The method of claim 25 or claim 29 in which the radiation sensitive ink comprises carbon black.

35. The method of claim 25 or claim 29 in which the unexposed areas of the ink coating are removed by acting on the support with aqueous covered dampening rollers of a printing press.

36. The method of claim 35 in which the dampening rollers are covered with lithographic fountain solution.

* * * * *

UNITED STATES PATENT AND TRADEMARK OFFICE

CERTIFICATE OF CORRECTION

PATENT NO. : 6,303,271 B1
DATED : October 16, 2001
INVENTOR(S) : Bennett et al.

It is certified that error appears in the above-identified patent and that said Letters Patent is hereby corrected as shown below:

<u>Column 1,</u>
Line 57, delete "firs" and insert therefor -- fits --

<u>Column 2,</u>
Line 42, delete "acryiate" and insert therefore -- acrylate --; also delete "acrylare" and insert therefor -- acrylate --
Line 45, "photopolynerization" and insert therefor -- photopolymerization --

<u>Column 5,</u>
Line 33, delete "In frared" and insert therefor -- Infrared --

<u>Column 6,</u>
Line 19, delete "g m$^2$" and insert therefor -- $g/m^2$ --

<u>Column 8,</u>
Line 7, delete "11" and insert therefor -- 1 --

<u>Column 9,</u>
Line 1, delete "10" and insert therefor -- 26 --

Signed and Sealed this

Twenty-first Day of May, 2002

*Attest:*

JAMES E. ROGAN

*Attesting Officer*

*Director of the United States Patent and Trademark Office*